United States Patent
Lee et al.

(10) Patent No.: US 12,421,424 B2
(45) Date of Patent: Sep. 23, 2025

(54) SLURRY COMPOSITION AND METHOD OF MANUFACTURING INTEGRATED CIRCUIT DEVICE BY USING THE SAME

(71) Applicant: SAMSUNG ELECTRONICS CO., LTD., Suwon-si (KR)

(72) Inventors: Wooin Lee, Hwaseong-si (KR); Jihye Kim, Anseong-si (KR); Seungho Park, Seoul (KR); Jaewoo Lee, Anseong-si (KR); Jaeik Lee, Anseong-si (KR); Jaehak Lee, Anseong-si (KR); Bohyeok Choi, Anseong-si (KR); Jungeun Kang, Seoul (KR); Boyun Kim, Hwaseong-si (KR); Sangkyun Kim, Hwaseong-si (KR); Hyukmin Kim, Yongin-si (KR)

(73) Assignees: SAMSUNG ELECTRONICS CO., LTD.; KCTECH CO., LTD.

( * ) Notice: Subject to any disclaimer, the term of this patent is extended or adjusted under 35 U.S.C. 154(b) by 346 days.

(21) Appl. No.: 18/098,244

(22) Filed: Jan. 18, 2023

(65) Prior Publication Data
US 2023/0257630 A1 Aug. 17, 2023

(30) Foreign Application Priority Data
Jan. 25, 2022 (KR) ........................ 10-2022-0010693

(51) Int. Cl.
*C09G 1/02* (2006.01)
*C09K 3/14* (2006.01)
(Continued)

(52) U.S. Cl.
CPC .............. *C09G 1/02* (2013.01); *C09K 3/1409* (2013.01); *H01L 21/31053* (2013.01);
(Continued)

(58) Field of Classification Search
None
See application file for complete search history.

(56) References Cited

U.S. PATENT DOCUMENTS 6,346,741 B1 * 2/2002 Van Buskirk ........ C09K 3/1463
257/E21.651
8,062,547 B2 11/2011 Paik et al.
(Continued)

FOREIGN PATENT DOCUMENTS

KR 10-0641348 B1 11/2006
KR 10-0851235 B1 8/2008
(Continued)

*Primary Examiner* — Stephanie P Duclair
(74) *Attorney, Agent, or Firm* — Muir Patent Law, PLLC

(57) ABSTRACT

A slurry composition is used to treat a surface of a target structure including at least one of a first polishing target film and a second polishing target film, which include different materials from each other, by a chemical mechanical polishing (CMP) process. The slurry composition includes: polishing particles; a first inhibitor including a nonionic polymer to selectively bond to the first polishing target film; and a second inhibitor including an anionic polymer to selectively bond to the second polishing target film. A method of manufacturing an integrated circuit device includes: forming, on a substrate, a target structure including at least one of a first polishing target film and a second polishing target film; applying the slurry composition onto the target structure; and treating a surface of the target structure by a CMP process while the slurry composition covers the target structure.

11 Claims, 15 Drawing Sheets

(51) Int. Cl.
*H01L 21/3105* (2006.01)
*H01L 21/321* (2006.01)
*H10B 12/00* (2023.01)

(52) U.S. Cl.
CPC ......... *H01L 21/3212* (2013.01); *H10B 12/05* (2023.02); *H10B 12/482* (2023.02)

(56) References Cited

U.S. PATENT DOCUMENTS

| | | |
|---|---|---|
| 8,641,920 B2 | 2/2014 | Chang et al. |
| 2019/0292406 A1 | 9/2019 | Cho et al. |
| 2021/0005462 A1* | 1/2021 | Yoshino .................. C09G 1/04 |
| 2021/0009859 A1* | 1/2021 | Kim .................... C09K 3/1463 |
| 2021/0087431 A1 | 3/2021 | Liang et al. |
| 2021/0301176 A1 | 9/2021 | Soumiya |

FOREIGN PATENT DOCUMENTS

| | | |
|---|---|---|
| KR | 10-1180225 B1 | 9/2012 |
| KR | 10-1693278 B1 | 1/2017 |
| KR | 10-1737943 B1 | 5/2017 |
| KR | 10-1741989 B1 | 5/2017 |
| KR | 10-2020-0061796 A | 6/2020 |
| KR | 10-2020-0062733 A | 6/2020 |

* cited by examiner

SLURRY COMPOSITION AND METHOD OF MANUFACTURING INTEGRATED CIRCUIT DEVICE BY USING THE SAME

CROSS-REFERENCE TO RELATED APPLICATION

This application is based on and claims priority under 35 U.S.C. § 119 to Korean Patent Application No. 10-2022-0010693, filed on Jan. 25, 2022, in the Korean Intellectual Property Office, the disclosure of which is incorporated by reference herein in its entirety.

BACKGROUND

1. Field

Embodiments relate to a slurry composition and a method of manufacturing an integrated circuit device using the same.

2. Description of the Related Art

In manufacturing processes of integrated circuit devices, to polish surfaces of devices including highly integrated multilayer structures, CMP processes are mainly used. Along with the increasing degrees of integration of integrated circuit devices, it is increasingly significant to improve the reliability of polishing processes for manufacturing fine patterns.

SUMMARY

An embodiment is directed to a slurry composition used to treat a surface of a target structure that includes at least one of a first polishing target film and a second polishing target film, which include different materials from each other, by a chemical mechanical polishing (CMP) process, the slurry composition including: polishing particles; a first inhibitor including a nonionic polymer selectively bonded to the first polishing target film; and a second inhibitor including an anionic polymer selectively bonded to the second polishing target film.

An embodiment is directed to a method of manufacturing an integrated circuit device, the method including: forming, on a substrate, a target structure including at least one of a first polishing target film and a second polishing target film, which include different materials from each other. The method further includes: applying, onto the target structure, a slurry composition including polishing particles, a first inhibitor, which includes a nonionic polymer selectively bonded to the first polishing target film, and a second inhibitor, which includes an anionic polymer selectively bonded to the second polishing target film. The method further includes: forming a planarized target structure by treating a surface of the target structure by a chemical mechanical polishing (CMP) process while the slurry composition covers the target structure.

An embodiment is directed to a method of manufacturing an integrated circuit device, the method including: forming a silicon nitride film on a substrate. The method further includes: forming a planarized silicon nitride film by treating a surface of the silicon nitride film by a chemical mechanical polishing (CMP) process, using a slurry composition including polishing particles, a first inhibitor, which includes a nonionic polymer selectively bonded to a polysilicon layer, and a second inhibitor, which includes an anionic polymer selectively bonded to the silicon nitride film. The method further includes: processing the planarized silicon nitride film.

BRIEF DESCRIPTION OF THE DRAWINGS

Features will become apparent to those of skill in the art by describing in detail example embodiments with reference to the attached drawings in which.

DETAILED DESCRIPTION

Figure 1:
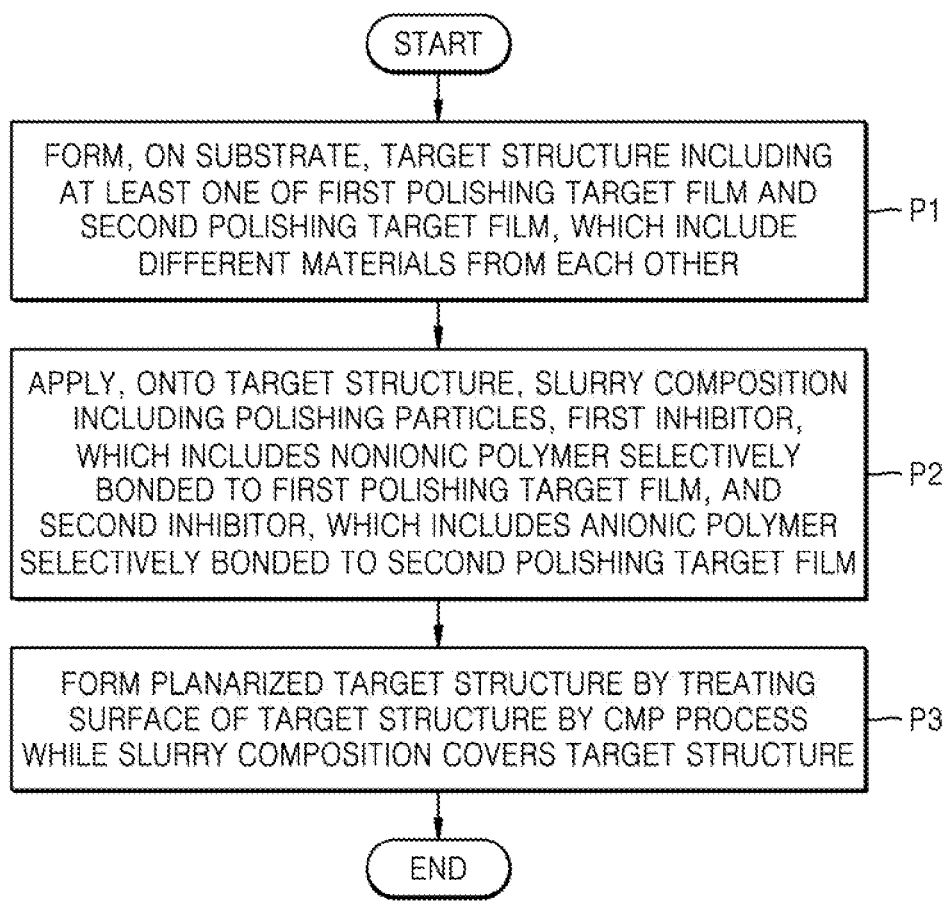
FIG. 1 is a flowchart illustrating a method of manufacturing an integrated circuit device, according to an example embodiment.

A slurry composition according to an example embodiment may be used to remove a protruding defect, which protrudes from a surface of a target structure toward the outside thereof. For example, a slurry composition according to an example embodiment may be used to treat a surface of a target structure including at least one of a first polishing target film and a second polishing target film, which include different materials from each other.

The slurry composition according to an example embodiment may include polishing particles. The slurry composition may include a first inhibitor, which includes a nonionic polymer selectively bonding to the first polishing target film. The slurry composition may include a second inhibitor, which includes an anionic polymer selectively bonding to the second polishing target film. The slurry composition may include deionized water, e.g., a balance of deionized water.

As used herein, the terms "bond" or "bonding" may refer to a physical bond (or bonding) or a chemical bond (or bonding), unless otherwise stated. For example, the terms "bond" or "bonding" used herein may refer to physical adsorption, an ionic bond, or a covalent bond.

The polishing particles may include modified colloidal silica polishing particles having negatively charged surfaces. In an example embodiment, the polishing particles may be modified such that surfaces thereof have COO— groups.

The polishing particles may have sizes selected from a range of about 10 nm to about 200 nm. For example, the polishing particles may have sizes selected from a range of about 30 nm to about 150 nm, or a range of about 30 nm to about 100 nm. The polishing particles may be present in an amount of about 0.1% by weight (wt %) to about 10.0 wt %, based on a total weight of the slurry composition.

The nonionic polymer constituting the first inhibitor may include a material adapted to selectively adsorb only on the first polishing target film from among the first polishing target film and the second polishing target film. The nonionic polymer may suppress unnecessary loss of the first polishing target film during a CMP process by protecting some regions of the first polishing target film while the CMP process is performed using the slurry composition.

The anionic polymer constituting the second inhibitor may include a material adapted to selectively adsorb only on the second polishing target film from among the first polishing target film and the second polishing target film. The anionic polymer may suppress unnecessary loss of the second polishing target film during a CMP process by protecting some regions of the second polishing target film while the CMP process is performed using the slurry composition.

In an example embodiment, the first polishing target film may include a polysilicon film. In this case, the nonionic polymer may include an oxazoline group-containing polymer, polyethylene glycol, polypropylene glycol, polyoxyalkylene alkyl ethers, polyoxyalkylene alkyl esters, polyoxyethylene methyl ether, polyethylene glycol sulfonic acid, polyvinyl alcohol, polyethylene oxide, polypropylene oxide, polyalkyl oxide, polyoxyethylene oxide, a polyethylene oxide-propylene oxide copolymer, cellulose, methyl cellulose, methyl hydroxyethyl cellulose, methyl hydroxypropyl cellulose, hydroxyethyl cellulose, carboxymethyl cellulose, carboxymethyl hydroxyethyl cellulose, sulfoethyl cellulose, carboxymethyl sulfoethyl cellulose, or a combination thereof. In the materials set forth above as examples of the nonionic polymer, the term "alkyl" refers to a C1-C20 alkyl group, and the term "alkylene alkyl" refers to a C3-C20 alkylene alkyl group.

The oxazoline group-containing polymer may include poly(2-methyl-2-oxazoline), poly(2-methyl-2-oxazoline) with a hydroxyl terminal group, poly(2-methyl-2-oxazoline) with α-benzyl and ω-azide terminal groups, poly(2-methyl-2-oxazoline) with an azide terminal group, poly(2-methyl-2-oxazoline) with a piperazine terminal group, poly(2-ethyl-2-oxazoline), poly(2-ethyl-2-oxazoline) with an alkyne terminal group, poly(2-ethyl-2-oxazoline) with α-benzyl and ω-thiol terminal groups, poly(2-ethyl-2-oxazoline) with α-methyl and ω-hydroxyethylamine terminal groups, poly(2-ethyl-2-oxazoline) with an amine terminal group, poly(2-ethyl-2-oxazoline) with a piperazine terminal group, poly(2-propyl-2-oxazoline), poly(2-propyl-2-oxazoline) with an azide terminal group, or a combination thereof.

In an example embodiment, the second polishing target film may include a silicon nitride film. In this case, the anionic polymer may include a sulfate or a sulfonate, e.g., a polymer including a sulfate or sulfonate. The anionic polymer may include a material that is anionic in the slurry composition having a pH selected from a range of about 3 to about 7. For example, the anionic polymer may include a material that is anionic in the slurry composition having a pH that is acidic, or having a pH selected from a range of about 3 to about 5.

For example, the anionic polymer may include a polyacrylic acid/sulfonic acid copolymer, a polysulfonic acid/acrylamide copolymer, polysulfonic acid, poly(styrene sulfonic acid), polyacrylamide methylpropanesulfonic acid, poly-α-methylstyrenesulfonic acid, poly-ρ-methylstyrenesulfonic acid, cellulose sulfate, dextran sulfate, heparin sulfate, or a combination thereof.

In the slurry composition according to an example embodiment, the nonionic polymer may be present in an amount of about 0.00005 wt % to about 0.5 wt %, based on the total weight of the slurry composition, and the anionic polymer may be present in an amount of about 0.005 wt % to about 0.02 wt %, based on the total weight of the slurry composition.

The slurry composition according to an example embodiment may further include a nonionic surfactant. Similar to the first inhibitor, the nonionic surfactant may be adapted to selectively adsorb only on the first polishing target film from among the first polishing target film and the second polishing target film, and thus may protect some regions of the first polishing target film.

When the slurry composition further includes the nonionic surfactant, because some regions of the first polishing target film may be protected by the nonionic polymer as well as the nonionic surfactant, an effect of suppressing unnecessary loss of the first polishing target film during a CMP process using the slurry composition may be further reinforced.

The nonionic surfactant may include a material that is different from a material included as the first inhibitor and a material included as the second inhibitor. In an example embodiment, the nonionic surfactant may include polyethylene glycol (PEG), polypropylene glycol (PPG), a polyethylene-propylene copolymer, polyalkyl oxide, polyoxyethylene oxide (PEO), polyethylene oxide, polypropylene oxide, or a combination thereof. In the materials set forth above as examples of the nonionic surfactant, the term "alkyl" refers to a C1-C20 alkyl group.

The nonionic surfactant may have a molecular weight of about 100 to about 1000. When the slurry composition includes the nonionic surfactant, the nonionic surfactant may be present in an amount of about 0.01 wt % to about 1.0 wt %, based on the total weight of the slurry composition.

The slurry composition according to an example embodiment may further include a pH regulator. The pH regulator may be used to provide the slurry composition with a pH selected from a range of about 3 to about 7, e.g., acidic, e.g., in a range of about 3 to about 5.

In an example embodiment, the pH regulator may include triethanolamine, trimethanolamine, monoethanolamine, diethanolamine, dimethylbenzylamine, ethoxybenzylamine, 2-amino-2-methyl-1-propanol, 2-amino-2-ethyl-1,3-propanediol, tris(hydroxymethyl)aminomethane, 2-amino-1-butanol, 2-amino-2-methyl-1,3-propanediol, dimethylaminomethylpropanol, diethylaminoethanol, monoisopropanolamine, aminoethylethanolamine, 3-amino-1-propanol, 2-amino-1-propanol, 1-amino-2-propanol, 1-amino-pentanol, 2-(2-aminoethylamino) ethanol, 2-dimethylamino-2-methyl-1-propanol, N,N-diethylethanolamine, or a combination thereof.

When the slurry composition includes the pH regulator, the pH regulator may be present in an amount of about 0.01 wt % to about 1.0 wt %, based on the total weight of the slurry composition.

The slurry composition according to an example embodiment may further include a biocide. The biocide may prevent the slurry composition or a target structure, to which the slurry composition is applied, from being contaminated with microorganisms.

In an example embodiment, the biocide may include tetramethylammonium chloride, tetraethylammonium chloride, tetrapropylammonium chloride, alkylbenzyldimethylammonium chloride, alkylbenzyldimethylammonium hydroxide, sodium chlorite, sodium hypochlorite, or a combination thereof. In the material set forth above as examples of the biocide, the term "alkyl" refers to a C1-C20 alkyl group.

When the slurry composition includes the biocide, the biocide may be present in an amount of about 0.001 wt % to about 0.5 wt %, based on the total weight of the slurry composition.

The slurry composition according to an example embodiment may be used to polish a surface of a target structure including at least one of a first polishing target film and a second polishing target film, which include different materials from each other, by a CMP process, thereby effectively removing a defect that protrudes from the surface of the target structure toward the outside of the target structure, and improving, e.g., reducing, surface roughness of the target structure. In addition, while the surface of the target structure is being polished by the CMP process using the slurry composition according to an example embodiment, relatively flat portions of the target structure may be protected by the first inhibitor and/or the second inhibitor, thereby suppressing unnecessary loss of the target structure.

In manufacturing processes of integrated circuit devices, because polysilicon films and silicon nitride films each have excellent thermal stability and provide relatively easy processes in deposition and removal thereof, polysilicon films and silicon nitride films are used for various purposes. For example, considering a silicon nitride film, after the silicon nitride film is formed in various processes used for a manufacturing process of an integrated circuit device, various defects may remain on a surface of the silicon nitride film. The defects may adversely affect subsequent processes and cause yield in the manufacturing process of the integrated circuit device to be deteriorated. However, when a CMP process using a slurry composition according to the related art is applied to remove the defects remaining on the surface of the silicon nitride film, the silicon nitride film may have to be polished to remove a relatively great thickness to obtain a planarized silicon nitride film. Accordingly, because it is required to deposit the silicon nitride film to a greater thickness than needed, and the planarized silicon nitride film obtained after the CMP process may have a large thickness deviation depending on positions on the substrate, a process margin in a subsequent process may be decreased.

The slurry composition according to an example embodiment includes the first inhibitor, which includes the nonionic polymer selectively bonded to the first polishing target film from among the first polishing target film and the second polishing target film, and the second inhibitor, which includes the anionic polymer selectively bonded to the second polishing target film from among the first polishing target film and the second polishing target film. Accordingly, while protruding defects are being removed by polishing at least one of the first polishing target film and the second polishing target film by the CMP process using the slurry composition according to an example embodiment, unnecessary loss of a polishing target film, e.g., the first polishing target film and/or the second polishing target film, may be minimized. Therefore, a thickness deviation of each of the planarized first polishing target film and/or the planarized second polishing target film, which are obtained after the protruding defects are removed by the CMP process, may be prevented from being deteriorated or increased.

Figure 2A:
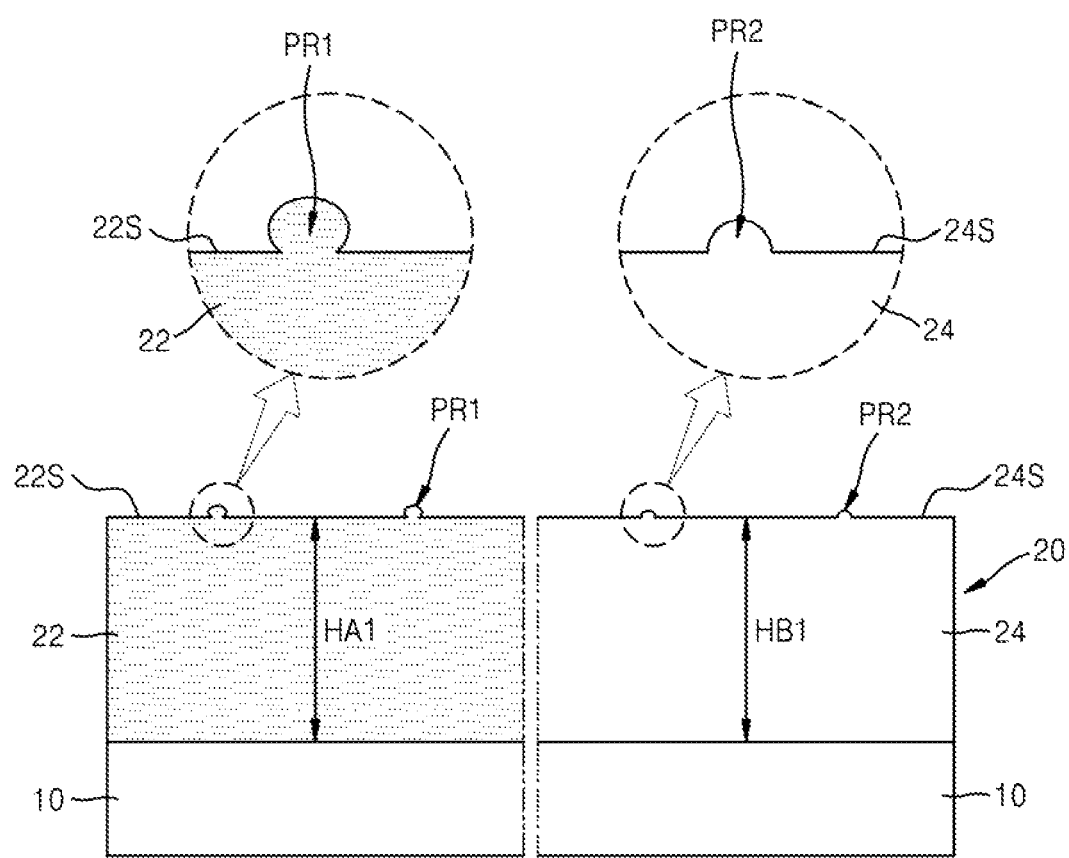
FIGS. 2A to 2C are cross-sectional views illustrating a sequence of processes of a method of manufacturing an integrated circuit device, according to an example embodiment.
Figure 2B:
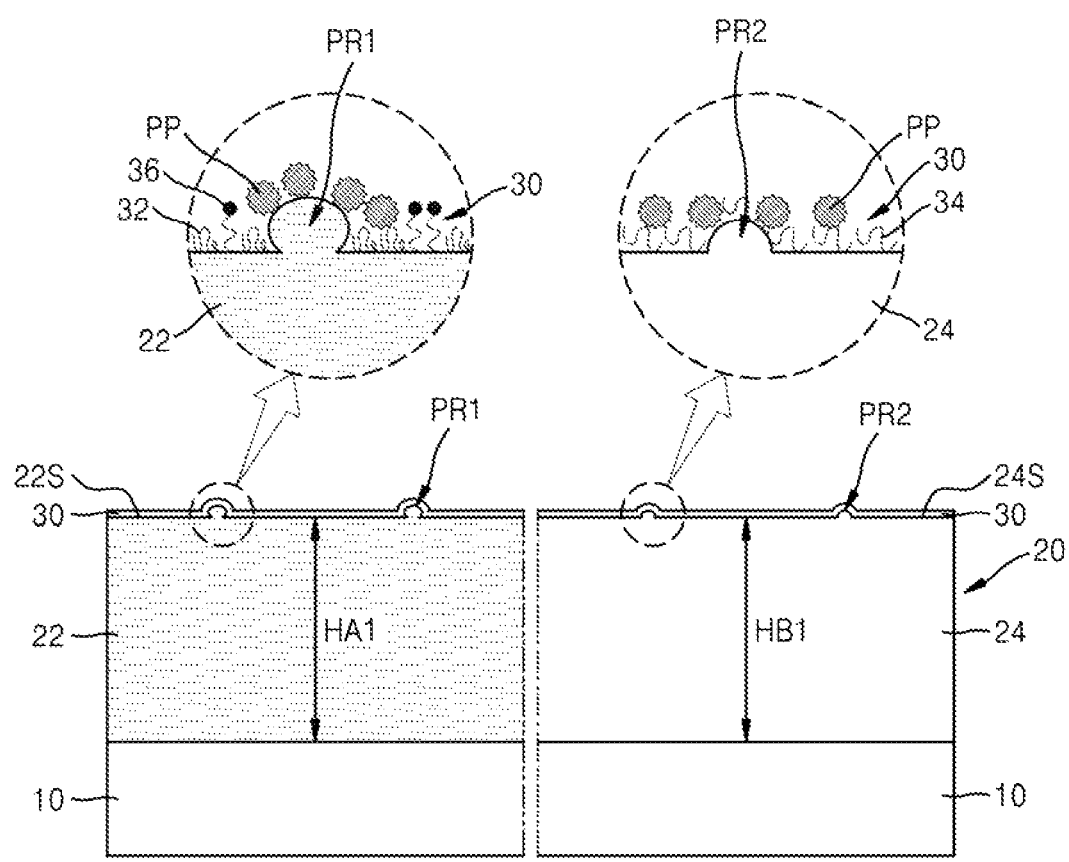
Figure 2C:
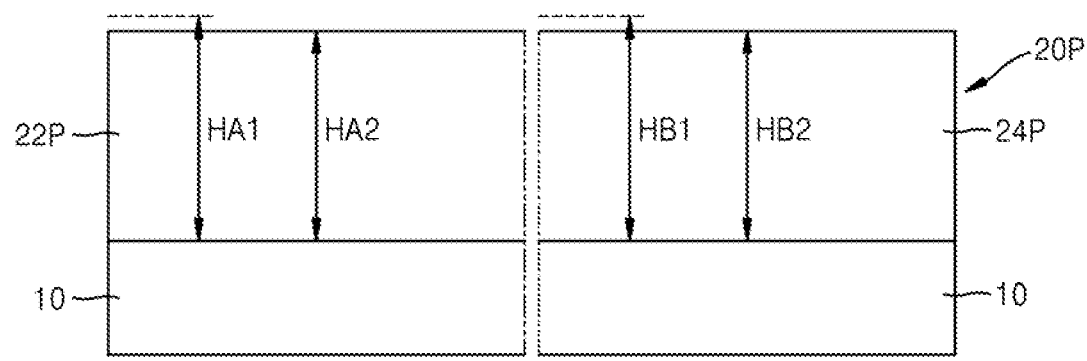

FIG. 1 is a flowchart illustrating a method of manufacturing an integrated circuit device, according to an example embodiment. FIGS. 2A to 2C are cross-sectional views illustrating a sequence of processes of a method of manufacturing an integrated circuit device, according to an example embodiment.

Referring to FIGS. 1 and 2A, in a process P1, a target structure 20 including at least one of a first polishing target film 22 and a second polishing target film 24, which include different materials from each other, may be formed on a substrate 10.

FIG. 2A illustrates an example in which the target structure 20 includes the first polishing target film 22 and the second polishing target film 24, but the target structure 20 may include only one selected from the first polishing target film 22 and the second polishing target film 24.

An exposed surface of the target structure 20 may include defects PR1 and PR2 protruding toward the outside of the target structure 20. Here, the first polishing target film 22 may include the defect PR1, and the second polishing target film 24 may include the defect PR2. The defect PR1 may be formed by various causes during a process of forming the first polishing target film 22, and the defect PR2 may be formed by various causes during a process of forming the second polishing target film 24.

As shown in FIG. 2A, the first polishing target film 22 may have a first thickness HA1 in a region thereof without the defect PR1, and the second polishing target film 24 may have a first thickness HB1 in a region thereof without the defect PR2.

In an example embodiment, the substrate 10 may include an elemental semiconductor, such as Si or Ge, or a compound semiconductor, such as SiGe, SiC, GaAs, InAs, or InP. The substrate 10 may include a conductive region (not shown). The conductive region may include an impurity-doped well, an impurity-doped structure, or a conductive layer. In an example embodiment, a lower structure may be arranged between the substrate 10 and the target structure 20. The lower structure may include various conductive regions, e.g., a wiring layer, a contact plug, a transistor, and the like, and insulating patterns insulating these conductive regions from each other.

In an example embodiment, each of the first polishing target film 22 and the second polishing target film 24 may include a silicon-containing film. For example, the first polishing target film 22 may include a polysilicon film and the second polishing target film 24 may include a silicon nitride film.

Referring to FIGS. 1 and 2B, in a process P2, a slurry composition 30 may be applied onto the target structure 20.

The slurry composition 30 may be or include the slurry composition having the configuration set forth above, according to an example embodiment.

The slurry composition 30 may include polishing particles PP, a first inhibitor 32 including a nonionic polymer that selectively bonds to the first polishing target film 22, and a second inhibitor 34 including an anionic polymer that selectively bonds to the second polishing target film 24. The slurry composition 30 may further include a third inhibitor 36 including a nonionic surfactant, which selectively bonds to the first polishing target film 22 and is a different material from a constituent material of each of the first inhibitor 32 and the second inhibitor 34.

Additional details of the slurry composition 30 may correspond to the above-described slurry composition according to an example embodiment.

FIG. 2B illustrates an example in which the slurry composition 30 further includes the third inhibitor 36 including a nonionic surfactant. In this case, as a result of applying the slurry composition 30 onto the target structure 20 according to the process P2, the first inhibitor 32 and the third inhibitor 36 may be selectively bonded to a surface of the first polishing target film 22, and the second inhibitor 34 may be selectively bonded to a surface of the second polishing target film 24, as shown in FIG. 2B.

Referring to FIGS. 1 and 2C, in a process P3, while the slurry composition 30 covers the target structure 20, a surface of the target structure 20 may be treated by a CMP process, thereby forming a planarized target structure 20P.

During the treatment of the surface of the target structure 20 by the CMP process according to the process P3, while the surface of the first polishing target film 22 is covered with the first inhibitor 32 and the third inhibitor 36 and the surface of the second polishing target film 24 is covered with the second inhibitor 34, shear stress may be applied to the defects PR1 and PR2 by applying local pressure to the defects PR1 and PR2, whereby the surface of each of the first polishing target film 22 and the second polishing target film 24 may be planarized by removing the defects PR1 and PR2, and as a result, the planarized target structure 20P may be formed on the substrate 10. The planarized target structure 20P may include a planarized first polishing target film 22P and a planarized second polishing target film 24P.

A level of an uppermost surface of each of the planarized first polishing target film 22P and the planarized second polishing target film 24P may be lower than a level of an uppermost surface of each of the first polishing target film 22 and the second polishing target film 24, which are included in the target structure 20 before the CMP process according to the process P3 is performed. The planarized first polishing target film 22P may have a second thickness HA2 that is less than the first thickness HA1, and the planarized second polishing target film 24P may have a second thickness HB2 that is less than the first thickness HB1. A difference between the second thickness HA2 and the first thickness HA1 and a difference between the second thickness HB2 and the first thickness HB1 may each be about 4 nm or less, e.g., about 2 nm or less.

In accordance with the method of manufacturing an integrated circuit device, described with reference to FIGS. 1 and 2A to 2C, while the slurry composition 30 according to an example embodiment covers the target structure 20, the surface of the target structure 20 is treated by the CMP process, whereby surface roughness of the target structure 20 may be improved, e.g., reduced, by effectively removing the defects PR1 and PR2 protruding toward the outside of the target structure 20, and simultaneously, unnecessary loss of the target structure 20 may be minimized in relatively flat portions of the target structure 20 without the defects PR1 and PR2. Therefore, manufacturing costs may be reduced in a manufacturing process of an integrated circuit device, and the manufacturing yield and reliability of the integrated circuit device may be improved.

Figure 3:
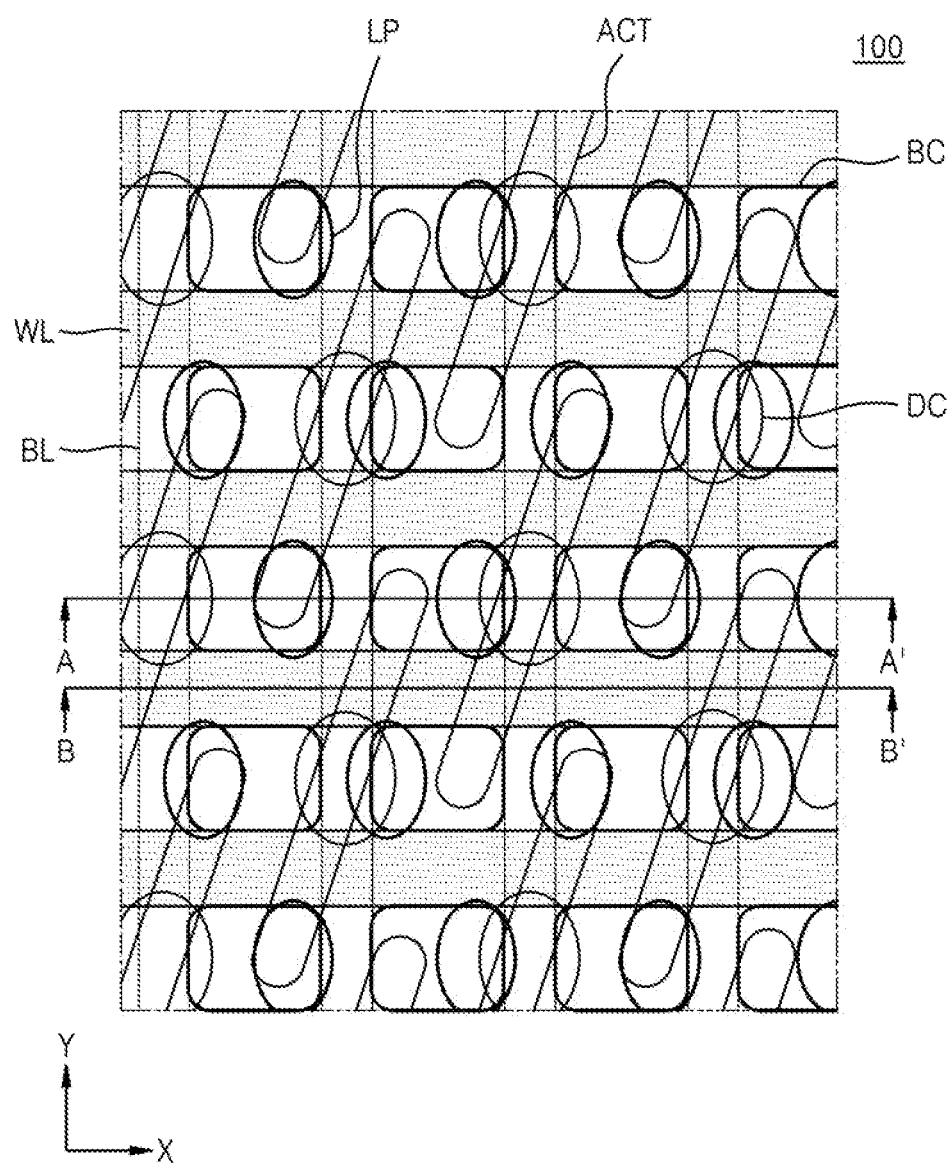
FIG. 3 is a schematic planar layout illustrating main components of an integrated circuit device which may be obtained according to a method of manufacturing an integrated circuit device, according to an example embodiment.

FIG. 3 is a schematic planar layout illustrating main components of an example integrated circuit device 100 which may be obtained according to the method of manufacturing an integrated circuit device, according to an example embodiment.

Referring to FIG. 3, an integrated circuit device 100 may include a plurality of active regions ACT. The plurality of active regions ACT may be arranged in an oblique direction with respect to a first horizontal direction (X direction) and a second horizontal direction (Y direction).

A plurality of word lines WL may extend parallel to each other in the first horizontal direction (X direction) across the plurality of active regions ACT. A plurality of bit lines BL may extend parallel to each other in the second horizontal direction (Y direction) over the plurality of word lines WL, the second horizontal direction (Y direction) intersecting with the first horizontal direction (X direction). The plurality of bit lines BL may be connected to the plurality of active regions ACT via direct contacts DC.

A plurality of buried contacts BC may be formed between two adjacent bit lines BL from among the plurality of bit lines BL. In an example embodiment, the plurality of buried contacts BC may be arranged in a line in the first horizontal direction (X direction) and the second horizontal direction (Y direction). A plurality of conductive landing pads LP may be respectively formed on the plurality of buried contacts BC. Each of the plurality of buried contacts BC and each of the plurality of conductive landing pads LP may connect a lower electrode (not shown) of a capacitor, which is formed on each of the plurality of bit line BL, to an active region ACT. At least a portion of each of the plurality of conductive landing pads LP may vertically overlap a buried contact BC.

FIGS. 4A to 4J are cross-sectional views illustrating a sequence of processes of a method of manufacturing an integrated circuit device, according to other example embodiments. An example method of manufacturing the integrated circuit device 100, which is shown in FIG. 3, will be described with reference to FIGS. 4A to 4J.

In FIGS. 4A to 4J, (a) is a cross-sectional view illustrating some components in an area corresponding to a cross-section taken along a line A-A' of FIG. 3, according to a process order, and (b) is a cross-sectional view illustrating some components in an area corresponding to a cross-section taken along a line B-B' of FIG. 3, according to a process order.

Figure 4A:
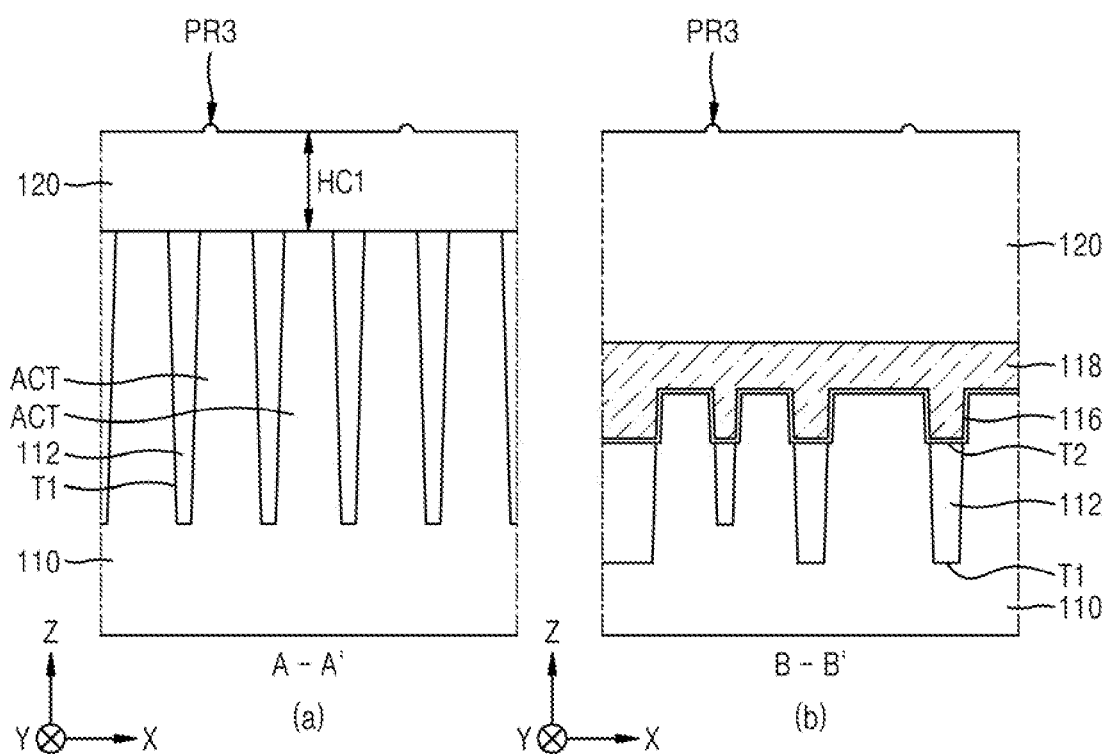
FIGS. 4A to 4J are cross-sectional views illustrating a sequence of processes of a method of manufacturing an integrated circuit device, according to other example embodiments.

Referring to FIG. 4A, a device isolation trench T1 may be formed in a substrate 110, and a device isolation film 112 may be formed in the device isolation trench T1. The plurality of active regions ACT may be defined in the substrate 110 by the device isolation film 112.

The substrate 110 may include an elemental semiconductor, such as Si or Ge, or a compound semiconductor, such as SiGe, SiC, GaAs, InAs, or InP. For example, the substrate 110 may include silicon, e.g., single-crystal silicon, polycrystalline silicon, or amorphous silicon.

In an example embodiment, the substrate 110 may include conductive regions, e.g., an impurity-doped well or an impurity-doped structure. The device isolation film 112 may include an oxide film, a nitride film, or a combination thereof.

A plurality of word line trenches T2 may be formed in the substrate 110. The plurality of word line trenches T2 may extend parallel to each other in the first horizontal direction (X direction) and may each have a line shape crossing an active region ACT. To form the plurality of word line trenches T2, each having a step at a bottom surface thereof, the device isolation film 112 and the substrate 110 may be respectively etched by separate etching processes such that an etch depth of the device isolation film 112 is different from an etch depth of the substrate 110.

A resulting product, in which the plurality of word line trenches T2 are formed, may be cleaned, and then, a gate dielectric film 116 and a word line 118 may be formed in each of the plurality of word line trenches T2. The gate dielectric film 116 and the word line 118 may be formed to fill a lower portion of each of the plurality of word line trenches T2. A plurality of word lines 118 in the plurality of word line trenches T2 may correspond to the plurality of word lines WL shown in FIG. 1.

The gate dielectric film 116 may include at least one selected from a silicon oxide film, a silicon nitride film, a silicon oxynitride film, an oxide/nitride/oxide (ONO) film, or a high-k film having a higher dielectric constant than a silicon oxide film. The high-k film may include $HfO_2$, $Al_2O_3$, $HfAlO_3$, $Ta_2O_3$, $TiO_2$, or a combination thereof. The plurality of word lines 118 may each include Ti, TiN, Ta, TaN, W, WN, TiSiN, WSiN, or a combination thereof.

As shown in FIG. 4A, a silicon nitride film 120 may be formed to fill an upper space, which remains above the gate dielectric film 116 and the word line 118 in each of the plurality of word line trenches T2, and to cover an upper surface of the substrate 110.

After the silicon nitride film 120 is formed, an exposed surface of the silicon nitride film 120 may include a defect PR3 protruding toward the outside of the silicon nitride film 120. The defect PR3 may be formed by various causes during the process of forming the silicon nitride film 120. As shown in FIG. 4A, a relatively flat portion of the silicon nitride film 120 without the defect PR3 may have a first thickness HC1.

Figure 4B:
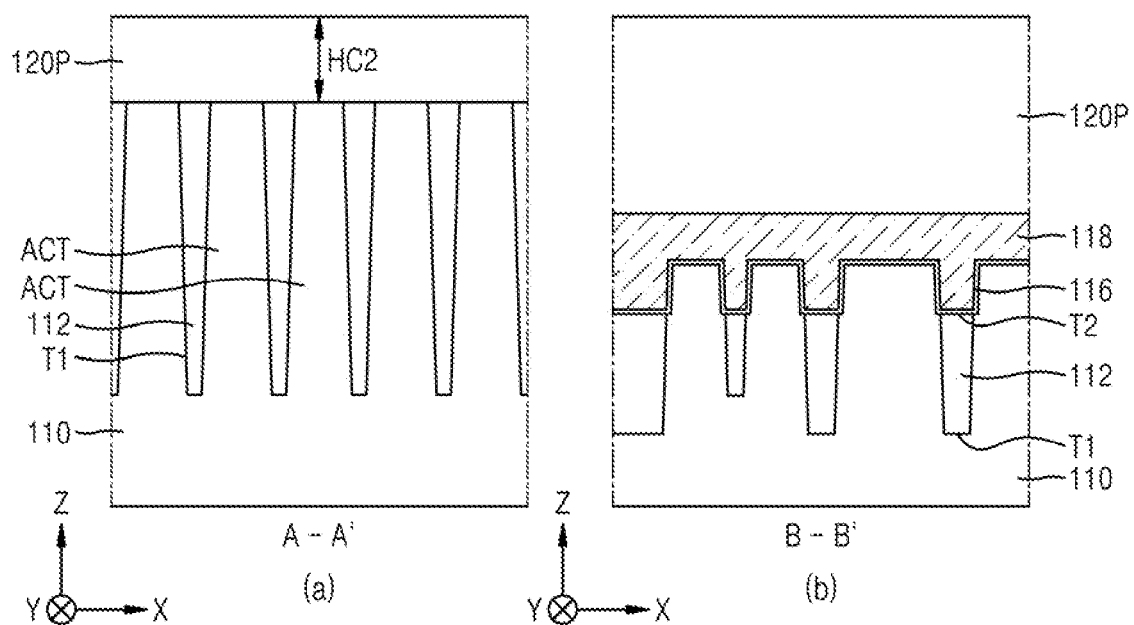

Referring to FIG. 4B, in a resulting product of FIG. 4A, the surface of the silicon nitride film 120 may be treated by a CMP process using the slurry composition according to an example embodiment, thereby forming a planarized silicon nitride film 120P. A more detailed configuration of the slurry composition according to an example embodiment is as described above.

To form the planarized silicon nitride film 120P in a process described with reference to FIG. 4B, similar processes to those described with reference to FIGS. 1, 2B, and 2C may be performed.

During the treatment of the surface of the silicon nitride film 120 shown in FIG. 4A by the CMP process using the slurry composition according to an example embodiment, in accordance with the process described with reference to FIG. 4B, while the surface of the silicon nitride film 120 is covered with the second inhibitor 34 (see FIG. 2B), shear stress may be applied to the defect PR3 by applying local pressure to the defect PR3, and thus, the defect PR3 may be removed from the silicon nitride film 120, thereby obtaining the planarized silicon nitride film 120P.

After the CMP process, a level of an uppermost surface of the planarized silicon nitride film 120P may be lower than a level of an uppermost surface of the silicon nitride film 120 shown in FIG. 4A. The planarized silicon nitride film 120P may have a second thickness HC2 that is less than the first thickness HC1 of the silicon nitride film 120 shown in FIG. 4A. A difference between the second thickness HC2 and the first thickness HC1 may be about 4 nm or less, e.g., about 2 nm or less.

While the slurry composition according to an example embodiment covers the silicon nitride film 120, the surface of the silicon nitride film 120 is treated by the CMP process, whereby the surface roughness of the silicon nitride film 120 may be improved, e.g., reduced, by effectively removing the defect PR3 from the silicon nitride film 120, and unnecessary loss of the silicon nitride film 120 may be minimized in portions of the silicon nitride film 120 without the defect PR3.

Figure 4C:
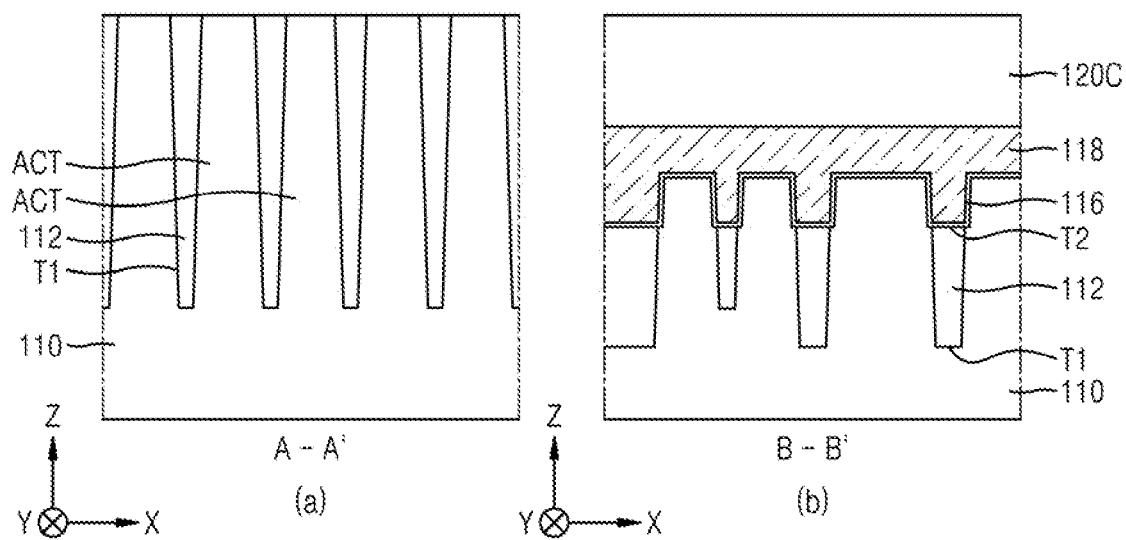

Referring to FIG. 4C, in a resulting product of FIG. 4B, an upper portion of the planarized silicon nitride film 120P may be removed such that the upper surface of the substrate 110 is exposed, thereby forming a word line capping pattern 120C to fill the upper space of each of the plurality of word line trenches T2.

In an example embodiment, to remove the upper portion of the planarized silicon nitride film 120P, a CMP or etchback process may be used. As described with reference to FIGS. 4A and 4B, after the planarized silicon nitride film 120P is formed by removing the defect PR3 on the exposed surface of the silicon nitride film 120, because a plurality of word line capping patterns 120C are formed by removing the upper portion of the planarized silicon nitride film 120P, as described with reference to FIG. 4C, surface roughness due to the defect PR3 on the exposed surface of the silicon nitride film 120 may be prevented from being transferred to an upper surface of the word line capping pattern 120C, and the plurality of word line capping patterns 120C having flat upper surfaces may be obtained.

Before or after the plurality of word lines 118 and the plurality of word line capping patterns 120C are formed, an ion implantation process for respectively forming a plurality of source/drain regions in upper portions of the plurality of active regions ACT may be performed.

Figure 4D:
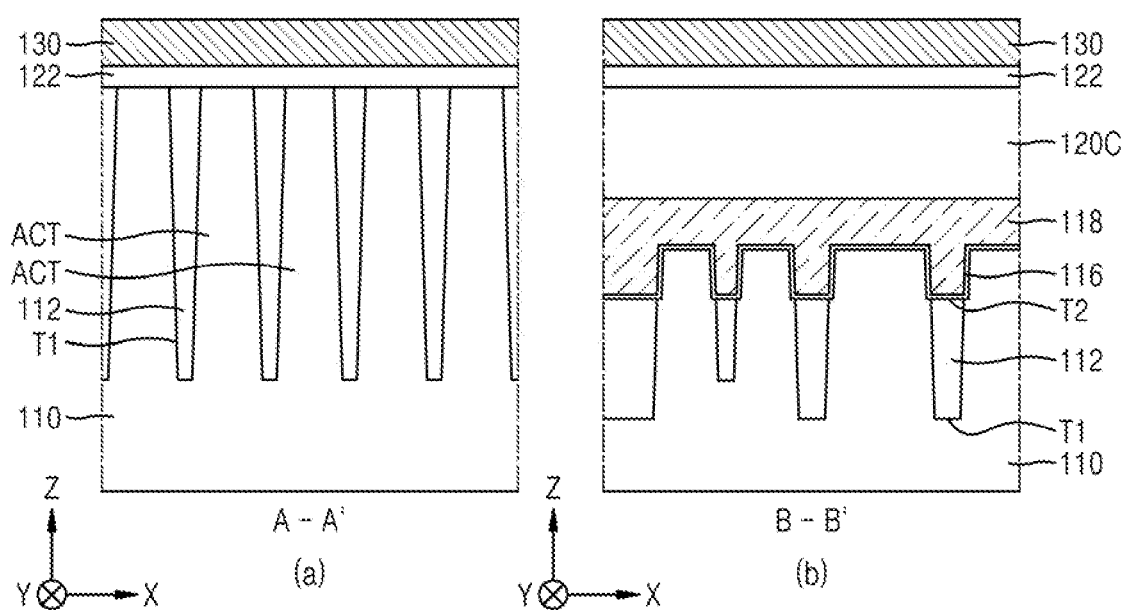

Referring to FIG. 4D, a buffer layer 122 and a lower conductive layer 130 may be formed in the stated order on a resulting product of FIG. 4C. The buffer layer 122 may be formed to cover upper surfaces of the plurality of active regions ACT, an upper surface of the device isolation film 112, and the upper surfaces of the plurality of word line capping patterns 120C. To form the buffer layer 122, a first silicon oxide film, a silicon nitride film, and a second silicon oxide film may be formed in the stated order on the substrate 110. The lower conductive layer 130 may include a doped polysilicon film.

In an example embodiment, to form the lower conductive layer 130, a doped polysilicon film is formed on the buffer layer 122, followed by treating a surface of the doped polysilicon film by a CMP process using the slurry composition according to an example embodiment, thereby planarizing an upper surface of the doped polysilicon film. To planarize the upper surface of the doped polysilicon film, similar processes to those described with reference to FIGS. 1, 2B, and 2C may be performed.

Figure 4E:
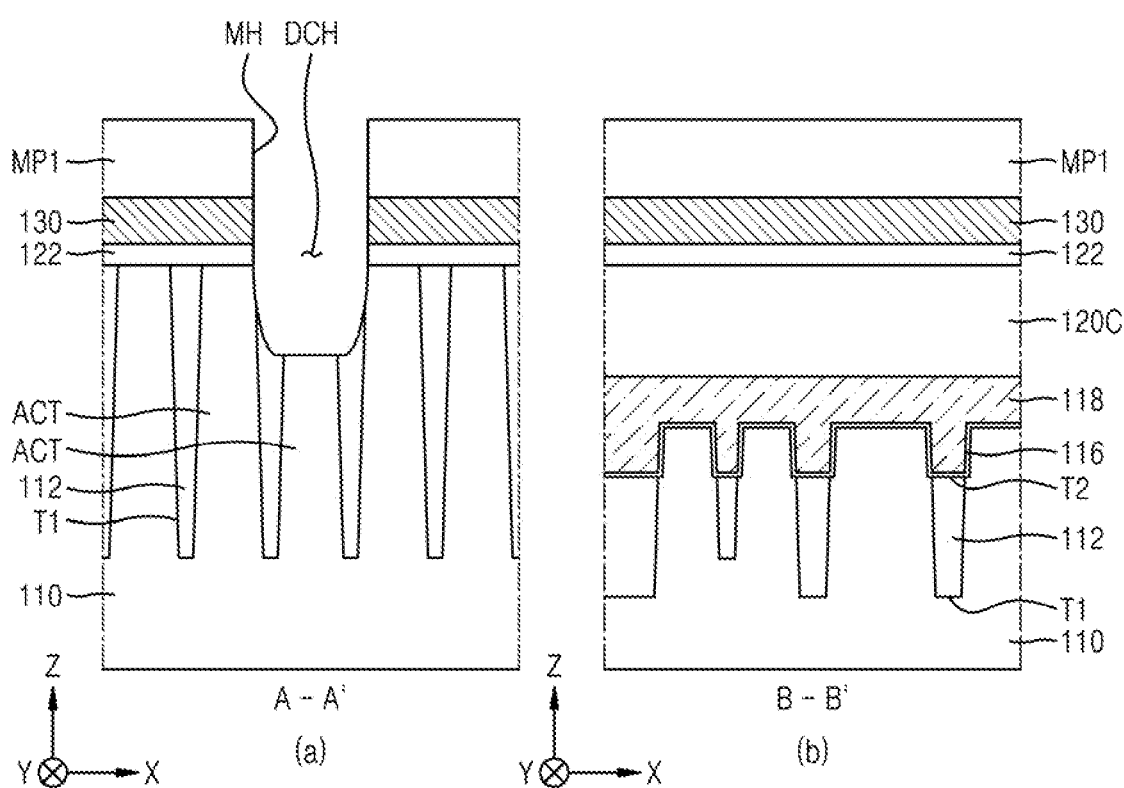

Referring to FIG. 4E, a mask pattern MP1 may be formed on the lower conductive layer 130, followed by partially etching the lower conductive layer 130, which is exposed by an opening MH of the mask pattern MP1, and partially etching the buffer layer 122, the substrate 110, and the device isolation film 112, which are under the lower conductive layer 130, thereby forming a direct contact hole DCH to expose the active region ACT of the substrate 110. The mask pattern MP1 may include, e.g., an oxide film, a nitride film, or a combination thereof.

Figure 4F:
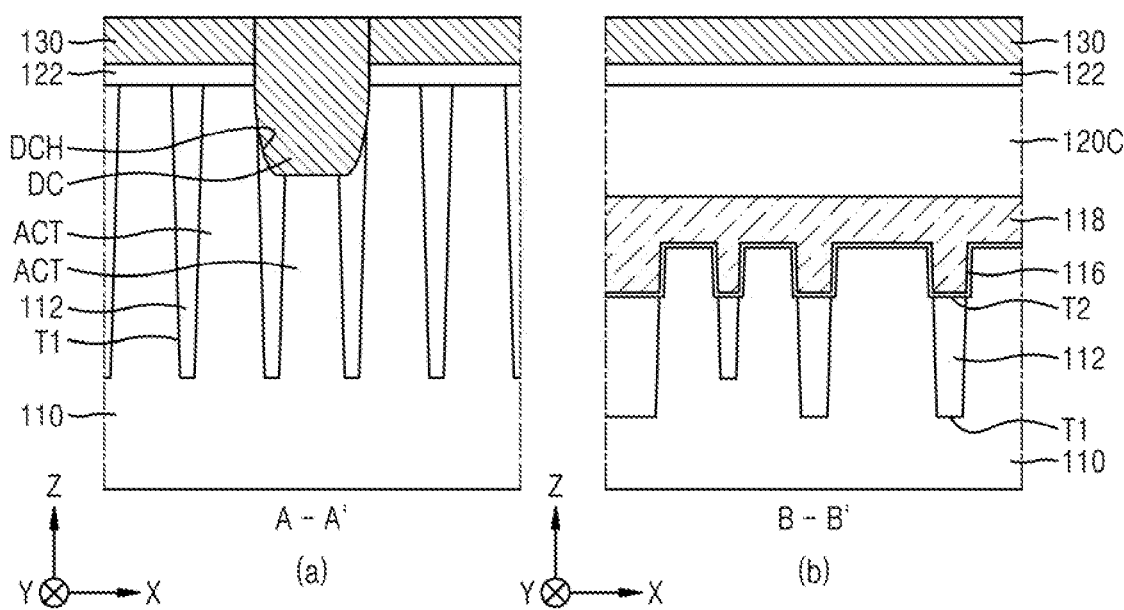

Referring to FIG. 4F, the mask pattern MP1 may be removed from a resulting product of FIG. 4E, and a direct contact DC may be formed in the direct contact hole DCH.

To form the direct contact DC, a doped polysilicon film may be formed in the direct contact hole DCH and on the lower conductive layer 130 such that the doped polysilicon film has a sufficient thickness to fill the direct contact hole DCH, and an unnecessary portion of the doped polysilicon film may be removed such that the doped polysilicon film remains only in the direct contact hole DCH. In an example embodiment, the direct contact DC may include a polysilicon film doped with an n-type dopant. The n-type dopant may be selected from phosphorus (P), arsenic (As), and antimony (Sb).

In an example embodiment, to form the direct contact DC, a doped polysilicon film may be formed to a sufficient thickness to fill the direct contact hole DCH, followed by treating a surface of the doped polysilicon film by a CMP process using the slurry composition according to an example embodiment, thereby planarizing an upper surface of the doped polysilicon film. To planarize the upper surface of the doped polysilicon film, similar processes to those described with reference to FIGS. 1, 2B, and 2C may be performed. Next, the direct contact DC may be formed from the doped polysilicon film having the planarized upper surface.

Figure 4G:
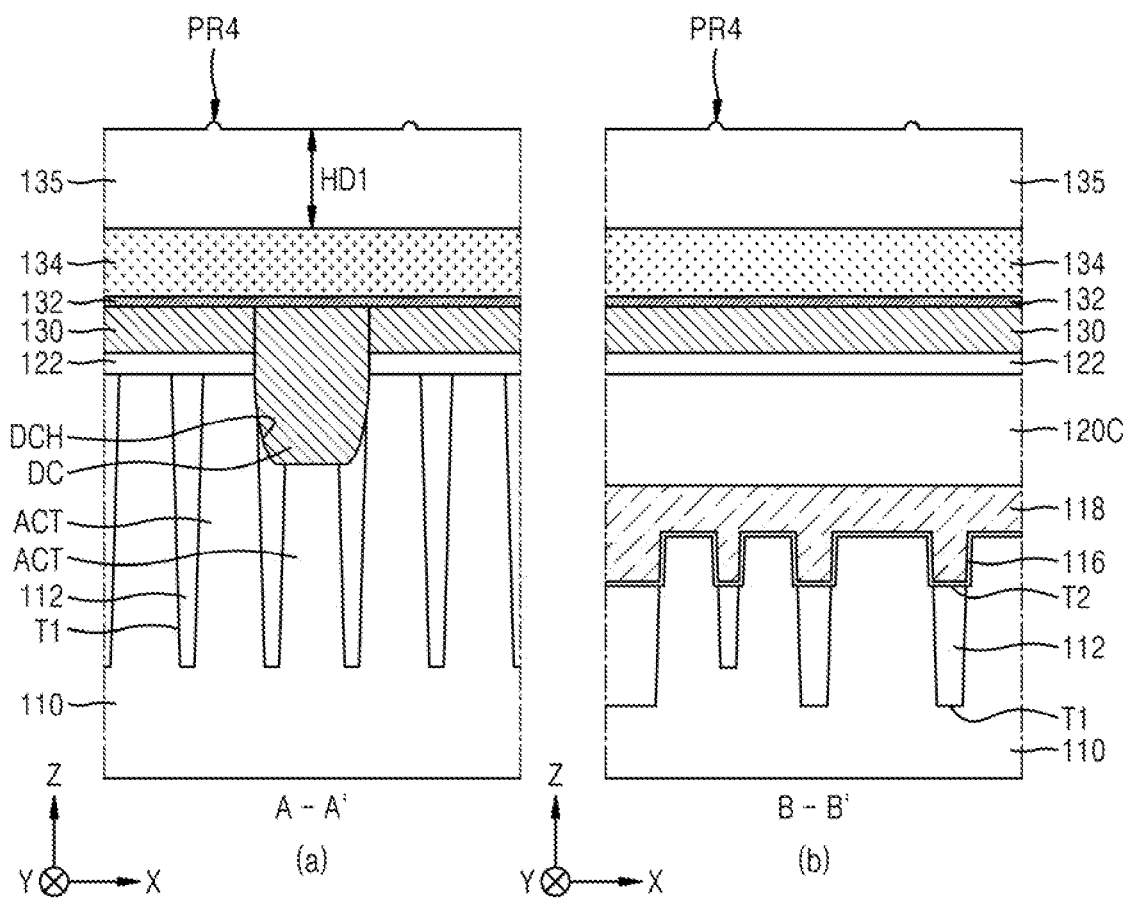

Referring to FIG. 4G, an intermediate conductive layer 132, an upper conductive layer 134, and a silicon nitride film 135 may be formed in the stated order on the lower conductive layer 130 and the direct contact DC.

Each of the intermediate conductive layer 132 and the upper conductive layer 134 may include a film including Ti, TiN, TiSiN, tungsten (W), WN, tungsten silicide ($WSi_x$), tungsten silicon nitride ($WSi_xN_y$), ruthenium (Ru), or a combination thereof. For example, the intermediate conductive layer 132 may include a TiN film and/or a TiSiN film, and the upper conductive layer 134 may include a film including Ti, TiN, W, WN, $WSi_xN_y$, Ru, or a combination thereof.

After the silicon nitride film 135 is formed, an exposed surface of the silicon nitride film 135 may include a defect PR4 protruding toward the outside of the silicon nitride film 135. The defect PR4 may be formed by various causes during the process of forming the silicon nitride film 135. As shown in FIG. 4G, a relatively flat region of the silicon nitride film 135 without the defect PR4 may have a first thickness HD1.

Figure 4H:
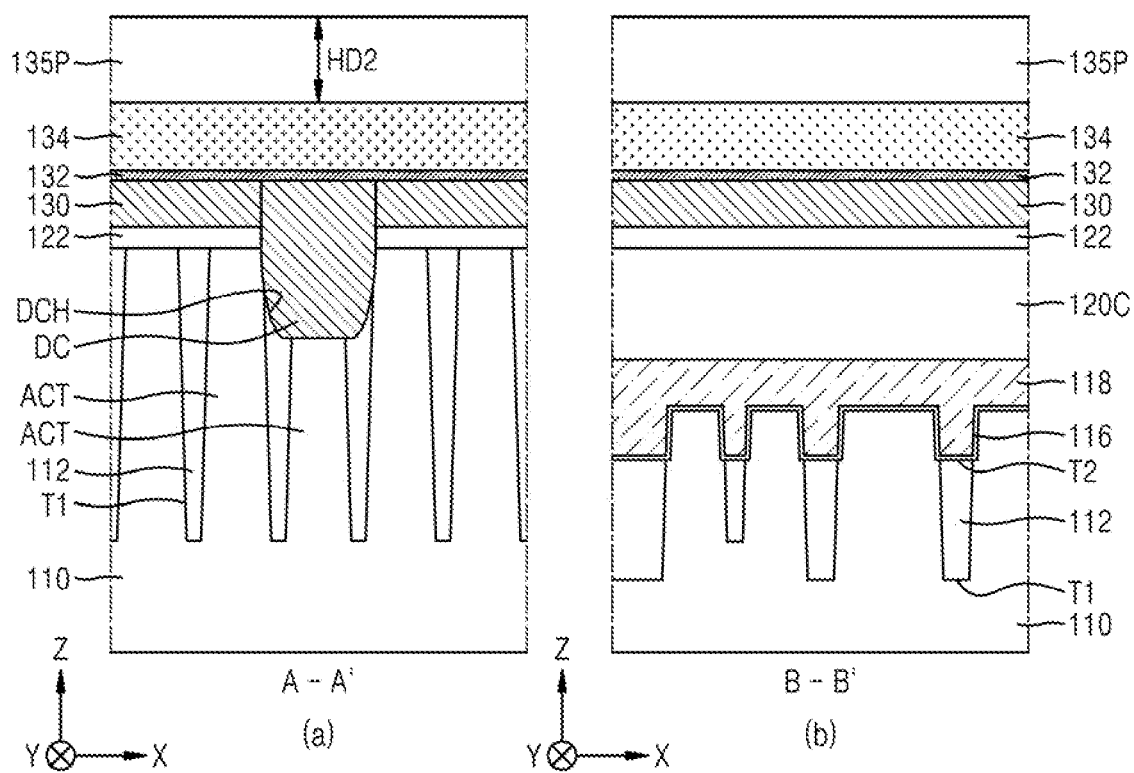

Referring to FIG. 4H, in a resulting product of FIG. 4G, the surface of the silicon nitride film 135 may be treated by a CMP process using the slurry composition according to an example embodiment, thereby forming a planarized silicon nitride film 135P. A more detailed configuration of the slurry composition according to an example embodiment is as described above.

To form the planarized silicon nitride film 135P in a process described with reference to FIG. 4H, similar processes to those described with reference to FIGS. 1, 2B, and 2C may be performed.

During the treatment of the surface of the silicon nitride film 135 shown in FIG. 4G by the CMP process using the slurry composition according to an example embodiment, in accordance with the process described with reference to FIG. 4H, while the surface of the silicon nitride film 135 is covered with the second inhibitor 34 (see FIG. 2B), shear stress may be applied to the defect PR4 by applying local pressure to the defect PR4, and thus, the defect PR4 may be removed from the silicon nitride film 135, thereby obtaining the planarized silicon nitride film 135P.

After the CMP process, a level of an uppermost surface of the planarized silicon nitride film 135P may be lower than a level of an uppermost surface of the silicon nitride film 135 shown in FIG. 4G. The planarized silicon nitride film 135P may have a second thickness HD2 that is less than the first thickness HD1 of the silicon nitride film 135 shown in FIG. 4G. A difference between the second thickness HD2 and the first thickness HD1 may be about 4 nm or less, e.g., about 2 nm or less.

While the slurry composition according to an example embodiment covers the silicon nitride film 135, the surface of the silicon nitride film 135 is treated by the CMP process, whereby surface roughness of the silicon nitride film 135 may be improved, e.g., reduced, by effectively removing the defect PR4 from the silicon nitride film 135, and unnecessary loss of the silicon nitride film 135 may be minimized in portions of the silicon nitride film 135 without the defect PR4.

Figure 4I:
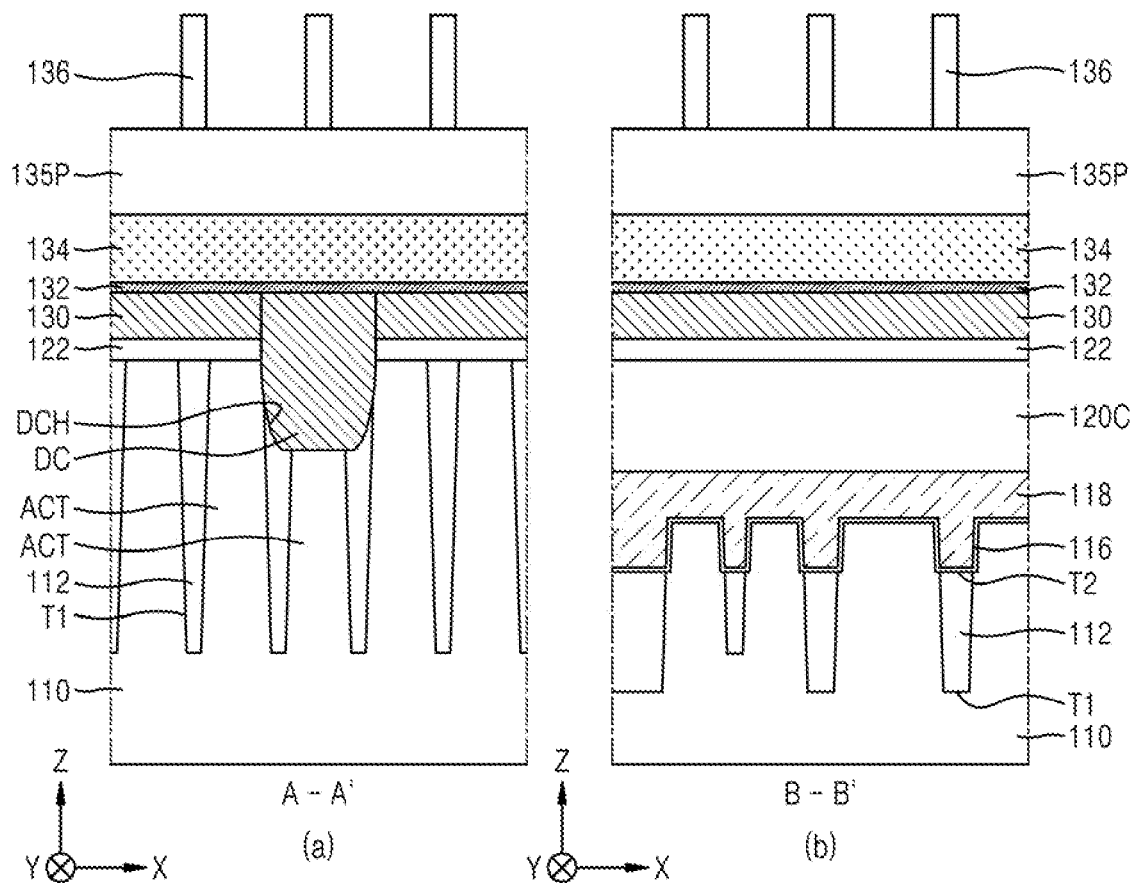

Referring to FIG. 4I, in a resulting product of FIG. 4H, a plurality of insulating capping masks 136 may be formed on the planarized silicon nitride film 135P. Each of the plurality of insulating capping masks 136 may include a line pattern extending lengthwise in the second horizontal direction (Y direction). The plurality of insulating capping masks 136 may each include a silicon nitride film.

Figure 4J:
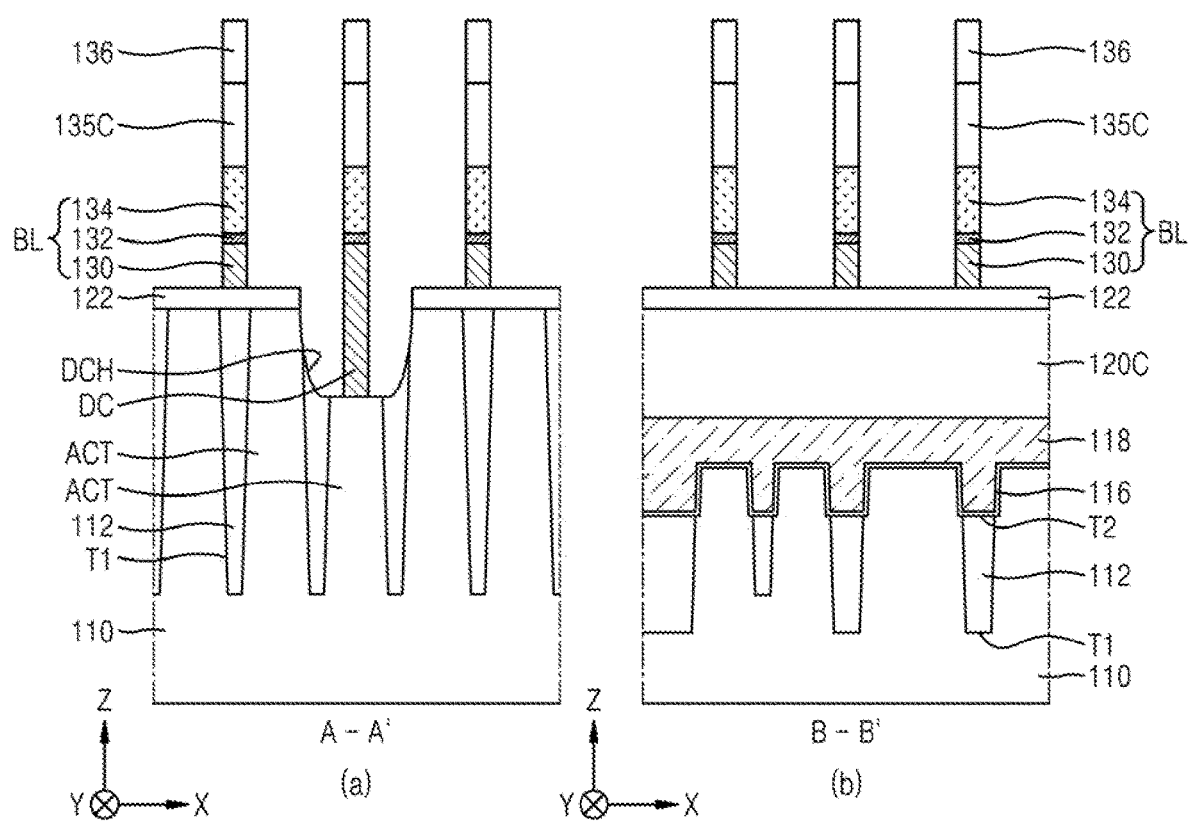

Referring to FIG. 4J, in a resulting product of FIG. 4I, an insulating capping pattern 135C or a plurality of insulating capping patterns 135C may be formed by etching the planarized silicon nitride film 135P using the plurality of insulating capping masks 136 as an etch mask, and then, the plurality of bit lines BL may be formed over the substrate 110 by partially etching each of the upper conductive layer 134, the intermediate conductive layer 132, the lower conductive layer 130, and the direct contact DC. The plurality of bit lines BL may each include respective remaining portions of the lower conductive layer 130, the intermediate conductive layer 132, and the upper conductive layer 134.

Subsequently, the integrated circuit device 100 shown in FIG. 3 may be manufactured by performing subsequent processes.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Specific examples of evaluation regarding respective performances of slurry compositions according to an example embodiment and slurry compositions according to comparison examples will now be described.

EVALUATION EXAMPLES 1 TO 6

Slurry compositions were prepared, each of the slurry compositions including: modified colloidal silica polishing particles having negatively charged surfaces at a pH of 3 to 5; an inhibitor (hereinafter referred to as "first inhibitor") for selectively bonding to a polysilicon film; an inhibitor (hereinafter referred to as "second inhibitor") for selectively bonding to a silicon nitride film; and deionized water.

In the slurry compositions, an amount of the polishing particles was fixed to be constant, an amount of polyvinyl alcohol as the first inhibitor was variously split within a range of 0.01 wt % to 0.05 wt %, and an amount of polystyrene sulfonic acid as the second inhibitor was variously split within a range of 0.005 wt % to 0.01 wt %.

COMPARISON EXAMPLES 1 TO 7

Slurry compositions for comparison were prepared by variously modifying the type, amount, and pH of each of the polishing particles, the first inhibitor, and the second inhibitor, which were included in the slurry compositions used in Evaluation Examples 1 to 6.

Table 1 shows types, amounts, and pHs of main components of each of the slurry compositions according to Evaluation Examples 1 to 6 and Comparison Examples 1 to 7.

Table 2 shows results obtained after a CMP process was performed using each of the slurry compositions according to Evaluation Examples 1 to 6 and Comparison Examples 1 to 7.

More specifically, for a polysilicon (Poly-Si) film and a silicon nitride (SiN) film obtained after the CMP process was performed using each of the slurry compositions according to Evaluation Examples 1 to 6 and Comparison Examples 1 to 7, a removal rate of each of the Poly-Si film and the SiN film, a result of measuring defects on a surface of each of the Poly-Si film and the SiN film, and a result of measuring surface roughness of each of the Poly-Si film and the SiN film are shown in Table 2.

To perform evaluations as in Table 2, common polishing conditions applied to Evaluation Examples 1 to 6 and Comparison Examples 1 to 7 were as follows.
Polisher: ST-01 (KCTECH Co., Ltd.)
Platen rotation speed: 48 rpm
Head rotation speed: 53 rpm
Applied pressure to polysilicon film: 0.5 psi
Applied pressure to silicon nitride film: 2.0 psi

TABLE 1

| | Conditions for slurry composition | | | | |
|---|---|---|---|---|---|
| | Polishing particles | Type and Amount [wt %] of first inhibitor | | Type and Amount [wt %] of second inhibitor | | pH |
| Evaluation Example 1 | A1 | B1 | 0.03 | C1 | 0.01 | 3.5 |
| Evaluation Example 2 | A1 | B1 | 0.03 | C1 | 0.01 | 4.5 |
| Evaluation Example 3 | A1 | B1 | 0.01 | C1 | 0.01 | 3.5 |
| Evaluation Example 4 | A1 | B1 | 0.05 | C1 | 0.01 | 3.5 |
| Evaluation Example 5 | A1 | B1 | 0.03 | C1 | 0.005 | 3.5 |
| Evaluation Example 6 | A1 | B1 | 0.03 | C1 | 0.015 | 3.5 |
| Comparison Example 1 | A2 | B1 | 0.03 | C1 | 0.015 | 3.5 |
| Comparison Example 2 | A1 | — | — | C1 | 0.015 | 3.5 |
| Comparison Example 3 | A1 | B1 | 0.03 | — | — | 3.5 |
| Comparison Example 4 | A1 | B1 | 0.03 | C1 | 0.01 | 2.5 |
| Comparison Example 5 | A1 | B1 | 0.03 | C1 | 0.01 | 8 |
| Comparison Example 6 | A1 | B2 | 0.03 | C1 | 0.01 | 3.5 |
| Comparison Example 7 | A1 | B1 | 0.03 | C2 | 0.01 | 3.5 |

In Table 1, the components included in each of the slurry compositions according to Evaluation Examples 1 to 6 and Comparison Examples 1 to 7 are as follows.
A1: Modified colloidal silica having negatively charged particle surfaces
A2: Non-modified colloidal silica
B1: Polyvinyl alcohol
B2: Polyvinylpyrrolidone
C1: Polystyrene sulfonic acid
C2: Polyphosphoric acid

TABLE 2

| | Removal rate | | Defects | | Roughness | |
|---|---|---|---|---|---|---|
| | Poly-Si [Å/min] | SiN [Å/min] | Poly-Si | SiN | Poly-Si | SiN |
| Evaluation Example 1 | 30 | 16 | ○ | ○ | ○ | ○ |
| Evaluation Example 2 | 42 | 12 | ○ | ○ | ○ | ○ |
| Evaluation Example 3 | 27 | 15 | Δ | ○ | Δ | ○ |
| Evaluation Example 4 | 31 | 17 | ○ | ○ | ○ | ○ |
| Evaluation Example 5 | 31 | 21 | ○ | Δ | ○ | Δ |
| Evaluation Example 6 | 35 | 10 | ○ | ○ | ○ | ○ |
| Comparison Example 1 | 35 | 5 | x | Δ | x | Δ |
| Comparison Example 2 | 15 | 16 | x | ○ | x | ○ |
| Comparison Example 3 | 30 | 125 | ○ | x | ○ | x |
| Comparison Example 4 | 12 | 11 | x | x | x | Δ |
| Comparison Example 5 | 348 | 2 | ○ | x | x | Δ |
| Comparison Example 6 | 65 | 12 | x | Δ | ○ | Δ |
| Comparison Example 7 | 8 | 2 | x | x | x | Δ |

In Table 2, evaluation criteria for the slurry compositions according to Evaluation Examples 1 to 6 and Comparison Examples 1 to 7 are as shown in Table 3:

TABLE 3

| Evaluation item | Classification | Poly-Si | SiN |
|---|---|---|---|
| Defects | ○ | 50 or less | 200 or less |
| | Δ | 200 or less | 400 or less |
| | x | greater than 200 | greater than 400 |
| Roughness | ○ | 0.15 nm or less | 0.1 nm or less |
| | Δ | 0.25 nm or less | 0.2 nm or less |
| | x | greater than 0.25 nm | greater than 0.2 nm |

From the results of Table 2, regarding Evaluation Example 1, the respective removal rates of the polysilicon film and the silicon nitride film were 30 Å/min and 16 Å/min, the respective numbers of defects remaining on the polysilicon film and the silicon nitride film, as a result of measuring defects, were 50 or less and 200 or less, and thus, it was confirmed that the slurry composition according to Evaluation Example 1 had a relatively good capability in defect removal. In addition, as a result of evaluating the roughness, the surface roughness of the polysilicon film was 0.15 nm or less and the surface roughness of the silicon nitride film was 0.1 nm or less, and thus, it was confirmed that the slurry composition according to Evaluation Example 1 had a relatively good capability in roughness control.

When the non-modified colloidal silica polishing particles were used as the polishing particles as in Comparison Example 1, or when the slurry composition did not include the first inhibitor as in Comparison Example 2, it was confirmed that those slurry compositions had deteriorated capabilities in defect removal and roughness control with respect to both the polysilicon film and the silicon nitride film. When the slurry composition did not include the second inhibitor as in Comparison Example 3, or when the pH of the slurry composition was 8 as in Comparison Example 5, those slurry compositions had deteriorated capabilities in defect removal and roughness control with respect to the silicon nitride film. When the pH of the slurry composition was 2.5 as in Comparison Example 4, or when polyphosphoric acid was used as the second inhibitor as in Comparison Example 7, it was confirmed that those slurry compositions had significantly deteriorated capabilities in defect removal and roughness control with respect to each of the polysilicon film and the silicon nitride film. Without being bound by theory, the reason of such results is thought to be that electrostatic interaction properties between a film and a slurry composition vary depending on a pH range of the slurry composition.

By way of summation and review, surface roughness of a target structure may have a significant influence on a subsequent process. When it is intended to improve, e.g., reduce, surface roughness of the target structure using a CMP process, it is desirable for the CMP process to effectively improve, e.g., reduce, surface roughness while minimizing unnecessary loss of the target structure.

As described above, embodiments relate to a slurry composition for chemical mechanical polishing (CMP), which may improve, e.g., reduce, surface roughness of an exposed surface of a target structure, and a method of manufacturing an integrated circuit device using the slurry composition.

Embodiments may provide a slurry composition capable of improving, e.g., reducing, surface roughness of an exposed surface of a target structure including at least one material, simultaneously with suppressing unnecessary loss in the target structure.

Embodiments may also provide a method of manufacturing an integrated circuit device, the method being capable of improving manufacturing yield and reliability of the integrated circuit device by improving, e.g., reducing, surface roughness of an exposed surface of a target structure including at least one material simultaneously with suppressing unnecessary loss in the target structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
    forming, on a substrate, a target structure including a first polishing target film and a second polishing target film, which are different materials from each other;
    applying, onto the target structure, a slurry composition including:
        polishing particles,
        a first inhibitor, which includes a nonionic polymer that selectively binds to the first polishing target film, and
        a second inhibitor, which includes an anionic polymer that selectively binds to the second polishing target film; and
    forming a planarized target structure using a chemical mechanical polishing (CMP) process while the slurry composition is applied onto the target structure.

2. The method as claimed in claim 1, wherein, in the forming of the planarized target structure, an exposed surface of the target structure includes a defect protruding toward an outside of the target structure, and the CMP process includes planarizing a first surface of the first polishing target film by applying local pressure to the defect such that shear stress is applied to the defect while the first inhibitor covers the first surface of the first polishing target film.

3. The method as claimed in claim 1, wherein each of the first polishing target film and the second polishing target film includes a silicon-containing film.

4. The method as claimed in claim 1, wherein:
    the first polishing target film includes a polysilicon film, and
    the second polishing target film includes a silicon nitride film.

5. The method as claimed in claim 1, wherein the slurry composition has a pH of 3 to about 7.

6. The method as claimed in claim 1, wherein:
    the first polishing target film includes a polysilicon film,
    the polishing particles include modified colloidal silica polishing particles having negatively charged surfaces, and
    the nonionic polymer includes at least one polymer selected from the group consisting of an oxazoline group-containing polymer, polyethylene glycol, polypropylene glycol, polyoxyalkylene alkyl ether, polyoxyalkylene alkyl ester, polyoxyethylene methyl ether, polyethylene glycol sulfonic acid, polyvinyl alcohol, polyethylene oxide, polypropylene oxide, polyalkyl oxide, polyoxyethylene oxide, a polyethylene oxide-propylene oxide copolymer, cellulose, methyl cellulose, methyl hydroxyethyl cellulose, methyl hydroxypropyl cellulose, hydroxyethyl cellulose, carboxymethyl cellulose, carboxymethyl hydroxyethyl cellulose, sulfoethyl cellulose, carboxymethyl sulfoethyl cellulose, and combinations thereof.

7. The method as claimed in claim 1, wherein:
    the second polishing target film includes a silicon nitride film,
    the polishing particles include modified colloidal silica polishing particles having negatively charged surfaces, and
    the anionic polymer includes a polymer including a sulfate or a sulfonate.

8. A method of manufacturing an integrated circuit device, the method comprising:
    forming a silicon nitride film on a substrate;
    forming a polysilicon film on the substrate; and
    planarizing the silicon nitride film using a chemical mechanical polishing (CMP) process, wherein the chemical mechanical polishing process includes applying a slurry composition onto the silicon nitride film and
    planarizing the polysilicon film using a CMP process that includes applying the slurry composition onto the polysilicon film,
    wherein the slurry composition includes:
        polishing particles,
        a first inhibitor, which includes a nonionic polymer that selectively binds to the polysilicon film, and
        a second inhibitor, which includes an anionic polymer that selectively binds to the silicon nitride film.

9. The method as claimed in claim 8, further comprising, before the forming of the silicon nitride film on the substrate:
    forming a trench in the substrate; and
    forming a word line in the trench to fill a lower portion of the trench, wherein, in the forming of the silicon nitride film, the silicon nitride film fills an upper portion of the trench and covers an upper surface of the substrate.

10. The method as claimed in claim 8, further comprising:
before the forming of the silicon nitride film, forming a conductive layer on the substrate, wherein, in the forming of the silicon nitride film, the silicon nitride film is formed to cover an upper surface of the conductive layer; and
after the CMP process, forming a plurality of bit lines by etching the conductive layer, and forming an insulating capping pattern by partially etching the planarized silicon nitride film.

11. The method as claimed in claim 8, wherein:
the slurry composition has a pH of 3 to 7,
the polishing particles include modified colloidal silica polishing particles having negatively charged surfaces,
the nonionic polymer includes at least one polymer selected from the group consisting of an oxazoline group-containing polymer, polyethylene glycol, polypropylene glycol, polyoxyalkylene alkyl ether, polyoxyalkylene alkyl ester, polyoxyethylene methyl ether, polyethylene glycol sulfonic acid, polyvinyl alcohol, polyethylene oxide, polypropylene oxide, polyalkyl oxide, polyoxyethylene oxide, a polyethylene oxide-propylene oxide copolymer, cellulose, methyl cellulose, methyl hydroxyethyl cellulose, methyl hydroxypropyl cellulose, hydroxyethyl cellulose, carboxymethyl cellulose, carboxymethyl hydroxyethyl cellulose, sulfoethyl cellulose, carboxymethyl sulfoethyl cellulose, and combinations thereof, and
the anionic polymer includes at least one polymer selected from the group consisting of a polyacrylic acid/sulfonic acid copolymer, a polysulfonic acid/acrylamide copolymer, polysulfonic acid, poly(styrene sulfonic acid), polyacrylamide methylpropanesulfonic acid, poly-α-methylstyrenesulfonic acid, poly-ρ-methylstyrenesulfonic acid, cellulose sulfate, dextran sulfate, heparin sulfate, and combinations thereof.

* * * * *